United States Patent
Lin et al.

(10) Patent No.: US 8,288,767 B2
(45) Date of Patent: Oct. 16, 2012

(54) THIN-FILM TRANSISTOR AND FORMING METHOD THEREOF

(75) Inventors: Ching-Fuh Lin, Taipei (TW); Chun-Yu Lee, Taipei (TW)

(73) Assignee: National Taiwan University, Taipei (TW)

( * ) Notice: Subject to any disclaimer, the term of this patent is extended or adjusted under 35 U.S.C. 154(b) by 390 days.

(21) Appl. No.: 12/651,992

(22) Filed: Jan. 4, 2010

(65) Prior Publication Data

US 2011/0163307 A1 Jul. 7, 2011

(51) Int. Cl.
*H01L 29/10* (2006.01)

(52) U.S. Cl. ... 257/43; 257/410; 257/642; 257/E21.007; 438/85; 438/104; 438/754

(58) Field of Classification Search .......................... None
See application file for complete search history.

(56) References Cited

U.S. PATENT DOCUMENTS

| | | | |
|---|---|---|---|
| 6,232,157 B1 * | 5/2001 | Dodabalapur et al. | ........ 438/158 |
| 2004/0056251 A1 | 3/2004 | Kim et al. | |
| 2006/0043447 A1 | 3/2006 | Ishii et al. | |
| 2006/0284171 A1 * | 12/2006 | Levy et al. | ........ 438/104 |
| 2007/0077681 A1 * | 4/2007 | Dotz et al. | ........ 438/99 |
| 2008/0057631 A1 | 3/2008 | Cheng et al. | |
| 2009/0127552 A1 * | 5/2009 | Li et al. | ........ 257/43 |
| 2009/0206341 A1 | 8/2009 | Marks et al. | |

FOREIGN PATENT DOCUMENTS

TW 1309050 4/2009

* cited by examiner

*Primary Examiner* — Benjamin Sandvik
*Assistant Examiner* — Scott R Wilson
(74) *Attorney, Agent, or Firm* — Stout, Uxa, Buyan & Mullins, LLP

(57) ABSTRACT

A method for forming a thin-film transistor (TFT) includes providing a substrate, forming a first patterned conducting layer on the substrate, forming an organic dielectric layer on the first patterned conducting layer and the substrate, forming a seeding layer on the organic dielectric layer, using the seeding layer as a crystal growing base to form an inorganic semiconductor layer on the seeding layer, and forming a second patterned conducting layer on the inorganic semiconductor layer.

22 Claims, 4 Drawing Sheets

THIN-FILM TRANSISTOR AND FORMING METHOD THEREOF

BACKGROUND OF THE INVENTION

1. Field of the Invention

The present invention relates to thin-film transistors, and more particularly, to methods for producing thin-film transistors under low temperatures.

2. Description of Related Art

Transparent electronics is one of the crucial technologies for the next generation of optoelectronic devices, such as displays, photovoltaics, and home electronic appliances. Particularly, transparent thin-film transistors (TTFTs) are key devices for realizing these transparent electronic products. Oxide wide band-gap semiconductors have been proposed as the active channel in the TTFTs. Among them, zinc oxide (ZnO) is an ideal material to produce the active channel because of its low photosensitivity, low cost, simple processing method, especially high mobility, and lack of environmental concerns.

In addition, conventional transparent thin-film transistors are usually "bottom gate" type, having a gate dielectric layer that is typically inorganic. Taking the zinc oxide semiconductor TFT as an example, its manufacturing method may comprise coating a sol-gel solution of zinc oxide on an inorganic dielectric layer, removing the solvent of the sol-gel solution by a conventional thermal process thus obtaining a gel, and annealing the gel with a high temperature to grow and form the zinc oxide semiconductor layer. Although the thin-film transistor produced by the above sol-gel method may have acceptable properties, its processing temperature is typically more than 500° C., resulting in high manufacturing cost, low yield, and restricted selection of materials to produce the substrate and the gate dielectric layer.

Accordingly, it would be advantageous to provide a novel thin-film transistor and forming method for resolving the above problems of the prior art.

SUMMARY OF THE INVENTION

The object of the present invention is to provide a thin-film transistor and forming method which can manufacture the thin-film transistor under low temperature; therefore, the selectivity of materials to produce the thin-film transistor can be broadened, the manufacturing cost can be decreased, and the yield can be increased.

According to the object, one embodiment of the present invention provides a method for forming a thin-film transistor, comprising the steps of providing a substrate, forming a first patterned conducting layer on the substrate, forming an organic dielectric layer on the first patterned conducting layer and the substrate, forming a seeding layer on the organic dielectric layer, using the seeding layer as a crystal-growing base to form an inorganic semiconductor layer on the seeding layer, and forming a second patterned conducting layer on the inorganic semiconductor layer.

According to the object, one embodiment of the present invention provides a thin-film transistor, comprising a substrate, a first patterned conducting layer on the substrate as the gate of the thin-film transistor, an organic dielectric layer on the first patterned layer and the substrate, a seeding layer on the organic dielectric layer, an inorganic semiconductor layer on the seeding layer, and a second patterned conducting layer on the inorganic semiconductor layer as the source and drain of the thin-film transistor.

DESCRIPTION OF THE PREFERRED EMBODIMENT

Reference will now be made in detail to specific embodiments of the invention. Examples of these embodiments are illustrated in the accompanying drawings. While the invention will be described in conjunction with these specific embodiments, it will be understood that the description is not intended to limit the invention to these embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well-known components and process operations are not described in detail in order not to unnecessarily obscure the present invention. While the drawings are illustrated in detail, it is appreciated that the quantity of the disclosed components may be greater or less than that disclosed, except for instances expressly restricting the amount of the components.

Figure 1:
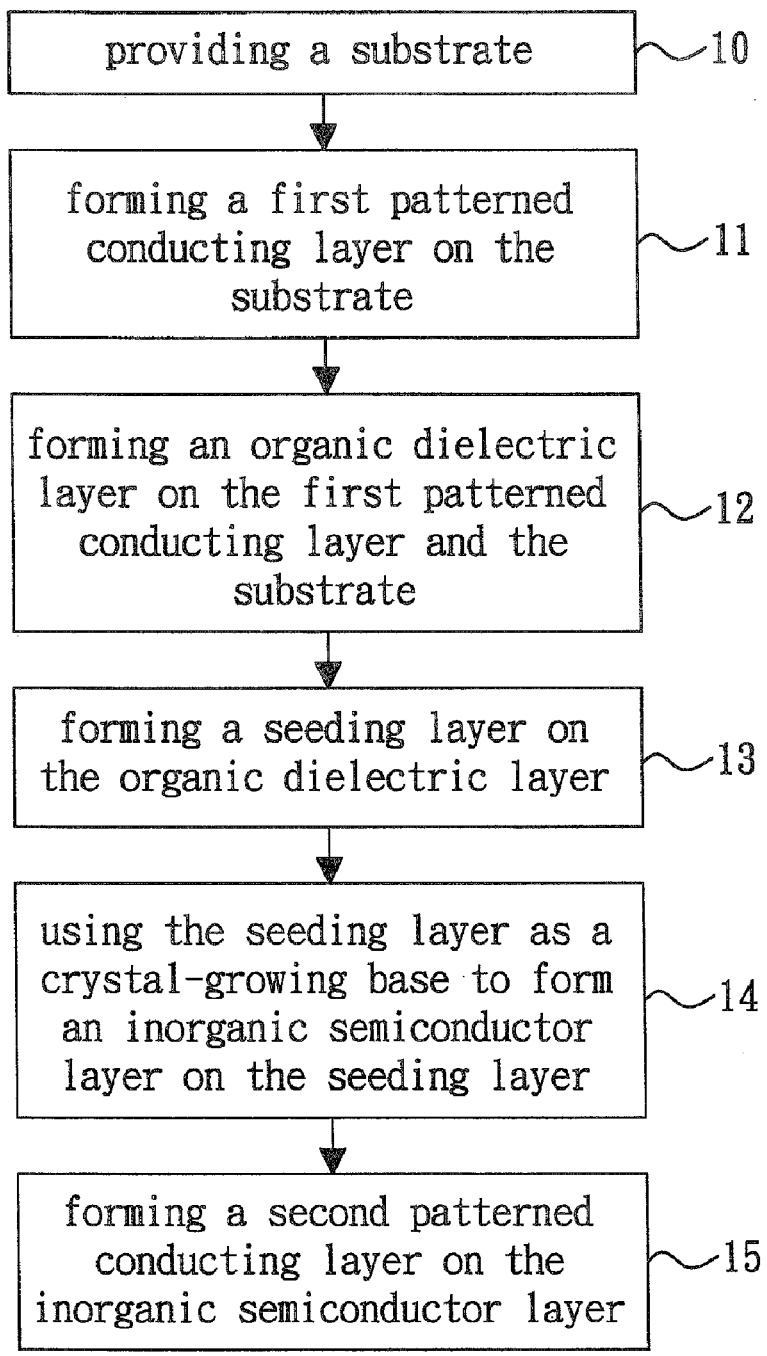
FIG. 1 shows a method for forming a thin-film transistor according to one embodiment of the present invention.

FIG. 1 shows a method for forming a thin-film transistor according to one embodiment of the present invention. The method comprising the steps of: step 10, providing a substrate; step 11, forming a first patterned conducting layer on the substrate; step 12, forming an organic dielectric layer on the first patterned conducting layer and the substrate; step 13, forming a seeding layer on the organic dielectric layer; step 14, using the seeding layer as a crystal-growing base to form an inorganic semiconductor layer on the seeding layer; step 15, forming a second patterned conducting layer on the inorganic semiconductor layer.

All of the above steps are controlled at temperatures equal to or less than 200° C.; therefore, the selectivity of materials to make the substrate and the organic dielectric layer is larger than that of the prior art. For example, the substrate of the present invention may comprise glass substrate, plastic substrate, flexible printed circuit (FPC), indium tin oxide (ITO), and/or other conducting or non-conducting materials. The organic dielectric layer of the present invention is employed for hindering current from passing therethrough, and can be made of a material with High K or Low K, where High K may be defined as materials with a dielectric coefficient more than 3.9, and Low K may be defined as materials with a dielectric coefficient less than 3.9, or, Low K may be defined as materials with a dielectric coefficient equal to or less than 2.8, which is usually used as an upper limit value of the Low K material in the art. In one embodiment of the present invention, the organic dielectric layer is made of polymethylmethacrylate (PMMA) or polystyrene (PS). In other embodiments of the present invention, the organic dielectric layer may be made of other transparent materials, such as transparent plastics including, for example, polyimide (PI), polyvinyl pyrrolidone (PVP), polyvinyl alcohol (PVA), polyethylene terephthalate (PET), polycarbonates (PC), polyethylene 2,6-naphthalate (PEN), polyethersulfone (PES), polyetherimide (PEI), metallocene based cyclic olefin copolymer (mCOC), and/or derivatives thereof.

The organic dielectric layer of the present invention may be formed by a solution process, such as spin coating, dip coating, and/or ink printing, or by a vapor process, such as thermal evaporation. If the organic dielectric layer is formed by a solution process, firstly the material for forming the organic dielectric layer is dissolved in a solvent to form an organic dielectric solution, secondly the organic dielectric solution is deposited on the first patterned conducting layer and the substrate, and thirdly the solvent is removed by a heating process to form the organic dielectric layer. The above-mentioned solvent may be selected from the group consisting of chloroform, dichloromethane, toluene, tetrahydrofuran, 1,2-dichlorobenzene, 1,4-dichlorobenzene, chlorobenzene, n-hexane, and/or combinations thereof.

The seeding layer of the present invention is employed as the crystal-growing base of the inorganic semiconductor layer, and it may be made of zinc oxide, gold, tin, and/or cobalt. In addition, the seeding layer may be formed by a physical vapor deposition process, such as evaporation or low temperature sputtering, to deposit micro and/or nano-grains of zinc oxide, gold, tin, and/or cobalt on the organic dielectric layer. Alternatively, the seeding layer may be formed by a solution process. For example, firstly the precursor for producing the seeding layer (such as zinc oxide, gold, tin, and/or cobalt) is dissolved in a solvent to form a seeding solution, secondly the seeding solution is formed on the organic dielectric layer by spin coating, dip coating, and the like methods, thirdly the solvent is removed to form an intermediate layer, and fourthly a heating or annealing process is performed to fabricate micro and/or nano-grains in the intermediate layer, so as to form the seeding layer. The solvent for dissolving the seeding precursor may be selected from the group consisting of isopropanol, methanol, ethyl alcohol, glycerol, propanol, and/or the like or combinations thereof.

The inorganic semiconductor layer of the present invention may be formed by a hydrothermal process, spin coating, dip coating, electrochemical method, thermal evaporation, chemical vapor deposition, molecular beam epitaxy, anode aluminum oxide (AAO) method, and/or the like.

Figure 2:
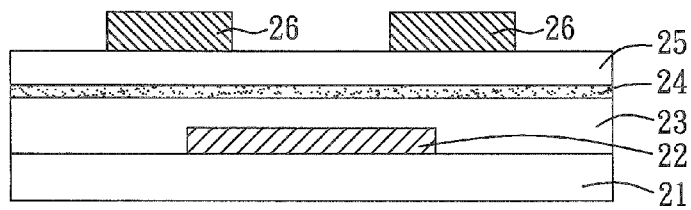
FIG. 2 shows a thin-film transistor according to one embodiment of the present invention.

FIG. 2 shows a thin-film transistor 20 according to one embodiment of the present invention. In this exemplary embodiment, the thin-film transistor 20 is a "bottom gate" type, and it may be produced by the method mentioned above. The thin-film transistor 20 comprises a substrate 21, a first patterned conducting layer 22 on the substrate 21 as the gate of the thin-film transistor 20, an organic dielectric layer 23 on the first patterned layer 22 and the substrate 21, a seeding layer 24 on the organic dielectric layer 23, an inorganic semiconductor layer 25 on the seeding layer 24, and a second patterned conducting layer 26 on the inorganic semiconductor layer 25 as the source and drain of the thin-film transistor 20.

Where the substrate 21 may be flexible and/or inflexible, it may be made, for example, of plastics, glass, ceramics, silicon, and/or other conducting or non-conducting materials.

The first patterned conducting layer 22 and the second patterned conducting layer 26 respectively function as gate, source, and drain, and they may be made of metal, inorganic conducting materials, and/or conducting polymers, such as gold, silver, molybdenum, aluminum, copper, indium tin oxide, antimony tin oxide, polythiophene, and/or poly(3,4-ethylene dioxythiophene). The organic dielectric layer 23 is employed for hindering current passing therethrough and may be made of any dielectric materials with High K or Low K as defined above. The seeding layer 24 may comprise zinc oxide, gold, tin, and/or cobalt. The morphology of the inorganic semiconductor layer 25 may be regular and/or irregular, and it may comprise nano grains, nano columns, nano clusters, and/or nano films.

The below will describe a method for forming a thin-film transistor according to the preferred embodiment of the present invention. First, a patterned indium tin oxide (ITO) functioning as the gate of the thin-film transistor is formed on a glass substrate. Then, the glass substrate with the patterned ITO is cleaned by isopropanol, acetone, methanol, and de-ionized water in sequence. Then, a polymethyl-methacrylate (PMMA) is dissolved in a solvent toluene with a concentration about 8 wt % to form an organic dielectric solution. The solvent may be chloroform, dichloromethane, and/or other solvents with a good solubility to the selected organic dielectric material. Then, the organic dielectric solution is formed on the glass substrate by spin coating. The spin coating process is controlled at about 8000 to 9000 rpm, 80 sec. Because the PMMA solution has a high concentration (8 wt %), high revolutions per minute will be needed to control the thickness of a later formed organic dielectric layer at about 200 nm. Then, a heating or annealing process controlled at about 150° C., 3 hr is performed to remove the solvent of the organic dielectric solution, and thus the organic dielectric layer is formed with a thickness of about 165 nm. Note that the heating or annealing process may be controlled at about 70° C. to 200° C. and retained about 1 hr to 3 hr in other embodiments of the present invention.

Then, a seeding solution is formed on the organic dielectric layer by a spin coating method. The seeding solution is about 0.5M and comprises zinc acetate dehydrate, monoethanalamine (MEA, as stabilized agent), and isopropanol (IPA, as solvent). Isopropanol is compliance and will not damage the organic dielectric layer; it exhibits better uniformity when the organic dielectric solution is spin coated. In addition, a preheat process may be performed to decrease the surface tension of the seeding solution. The preheat process may be controlled at 110° C. to 130° C., such as 120° C.

After the seeding solution, coated on the organic dielectric layer, is dried, an intermediate layer is formed. Then, another heating or annealing process controlled from room temperature to 150° C. is performed to fabricate micro and/or nano-grains in the intermediate layer, so as to form the seeding layer. Taking a zinc oxide seeding layer for example, the heating or annealing temperature is controlled at about 100° C. Furthermore, the material of the substrate and the organic dielectric layer determine the annealing or heating temperature. For example, if the substrate is a Flexible Printed Circuit (FPC), the annealing temperature can be limited below 150° C.; if the substrate is a glass substrate, the annealing temperature can be increased to 150° C. but should not be more than 200° C., or otherwise it will damage the organic dielectric layer, such as the above-mentioned PMMA layer. Further, the seeding layer is formed on the organic dielectric layer by a low temperature sputtering method in another preferred embodiment. Compared with the spin coating method, the seeding layer formed by the low temperature sputtering method exhibits better uniformity.

Then, a zinc oxide semiconductor layer (an inorganic semiconductor layer) with a thickness of about 980 nm is formed on the seeding layer by a hydrothermal process. The hydrothermal process is a wet chemical method performed in a closed container, the processing temperature and pressure of which differ from that of the sol-gel method. The method for forming the zinc oxide semiconductor layer comprises dissolving a zinc oxide by an aqueous solution to form a zinc oxide solution, where the zinc oxide solution is controlled at about 90° C. for 3 hr to perform the hydrothermal process. The aqueous solution comprises zinc nitrate dehydrate, hexamethylenetetramine, and de-ionized water.

The processing temperature for forming the zinc oxide semiconductor layer or other inorganic semiconductor layers, such as the temperature of the zinc oxide aqueous solution, is also determined by the material of the substrate and the organic dielectric layer. According to the embodiment of the present invention, the temperature of the zinc oxide solution should be controlled at about 55° C. to 100° C., and preferably 65° C. to 90° C. This is because the zinc oxide solution will not crystallize until the temperature exceeds 55° C., and too high of a temperature may result in too fast of a crystallization and thus result in bad crystalline quality.

Then, a second patterned conducting layer with a thickness of about 980 nm is formed on the zinc oxide semiconductor layer. The second patterned conducting layer functioning as a source and a drain of the thin-film transistor may comprise aluminum, and it may be formed by thermal evaporation or other well-known methods. Finally, a thin-film transistor produced under low temperature is finished, with the channel length and channel width of the produced thin-film transistor being about 30 μm and 100 μm respectively.

Figure 3:
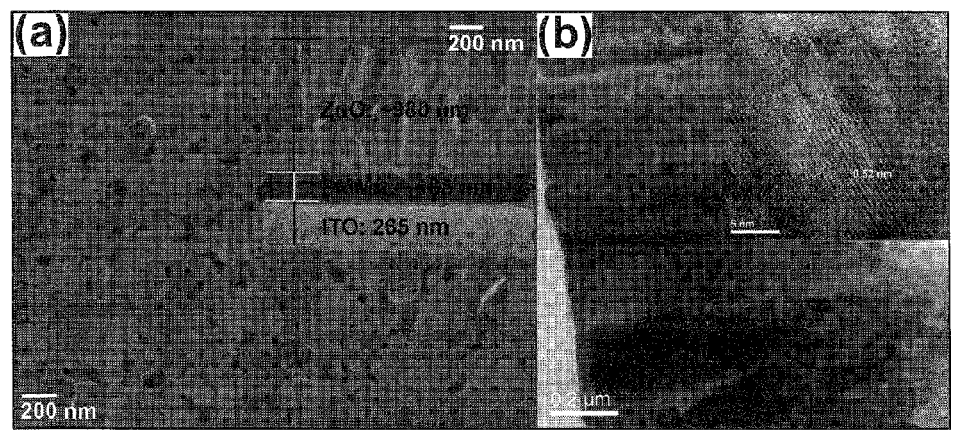
FIG. 3 shows the morphology of the produced thin-film transistor according to the preferred embodiment of the present invention, with the (a) portion being a scanning electron microscope (SEM) image and the (b) portion being a transmission electron microscopy (TEM) image.

FIG. 3 shows the morphology of the produced thin-film transistor according to the preferred embodiment of the present invention, with the (a) portion being an image from a scanning electron microscope (SEM) and the (b) portion being an image produced using transmission electron microscopy (TEM) imaging. The SEM image shows that by a hydrothermal process, the zinc oxide grains are compactly grown on the PMMA layer, and thus the carrier mobility can be improved. The TEM image shows that the zinc oxide semiconductor consists of many zinc oxide nanocolumns, and the HRTEM (insert) of the TEM image shows that the lattice distance measured from the lattice fringes along the growth axis of the zinc oxide is about 0.52 nm, which means that the zinc oxide semiconductor layer has a good crystalline property (e.g., quality).

Figure 4:
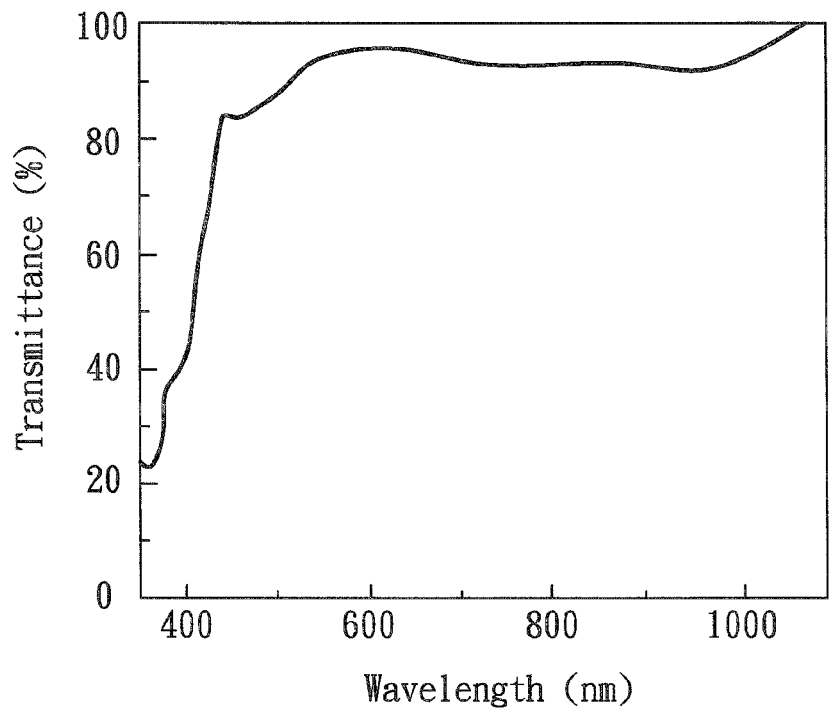
FIG. 4 is an optical transmittance spectrum of the produced thin-film transistor according to one embodiment of the present invention.

FIG. 4 is an optical transmittance spectrum of the produced thin-film transistor according to the preferred embodiment of the present invention, which is analyzed by a UV/Visible Absorption Spectrometer. As shown in FIG. 4, in a wavelength range of visible light from 450 nm to 800 nm, the produced thin-film transistor shows a high transmittance from 82% to 91% respectively.

Figure 5:
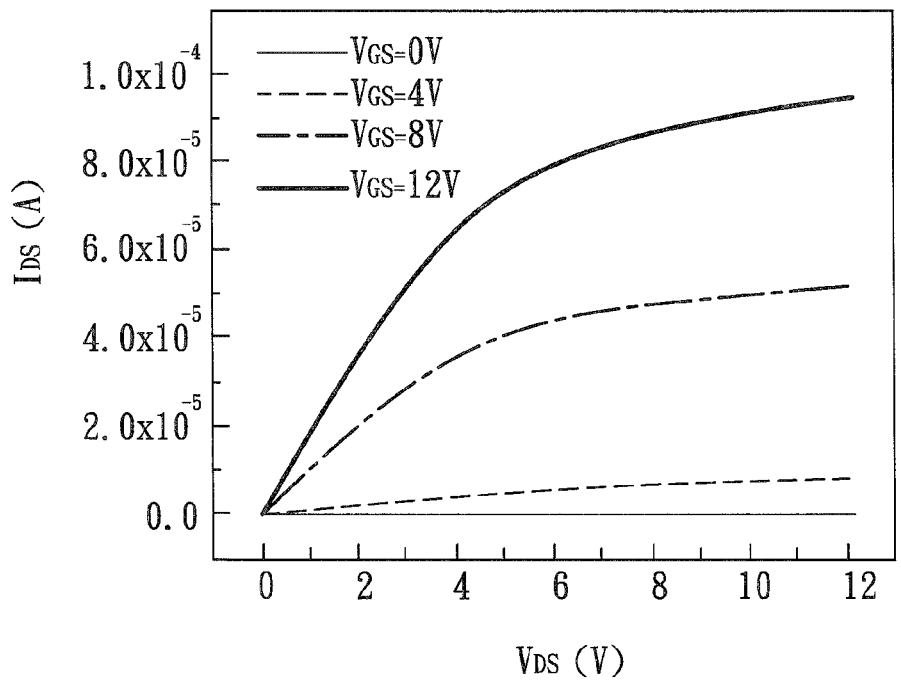
FIG. 5 shows the $V_{DS}$-$I_{DS}$ curve of the thin-film transistor according to one embodiment of the present invention.

FIG. 5 shows the $V_{DS}$-$I_{DS}$ curve of the thin-film transistor according to one embodiment of the present invention, where the $V_{GS}$=0V curve denotes operation under a constant voltage 0V exerted at gate with variant voltages being exerted to the source $V_{DS}$ (or drain) and variant currents being measured at the drain $I_{DS}$ (or source), and where curves $V_{GS}$=4V, $V_{GS}$=8V, and $V_{GS}$=12V have similar definitions. As shown in FIG. 5, when the exerting gate voltage $V_{DS}$ is large to an extent, the slope of each curve becomes flat, which indicates that the channel is saturated and that the output impedance of the thin-film transistor is large and sufficient to be desirable in most circuit applications.

Figure 6:
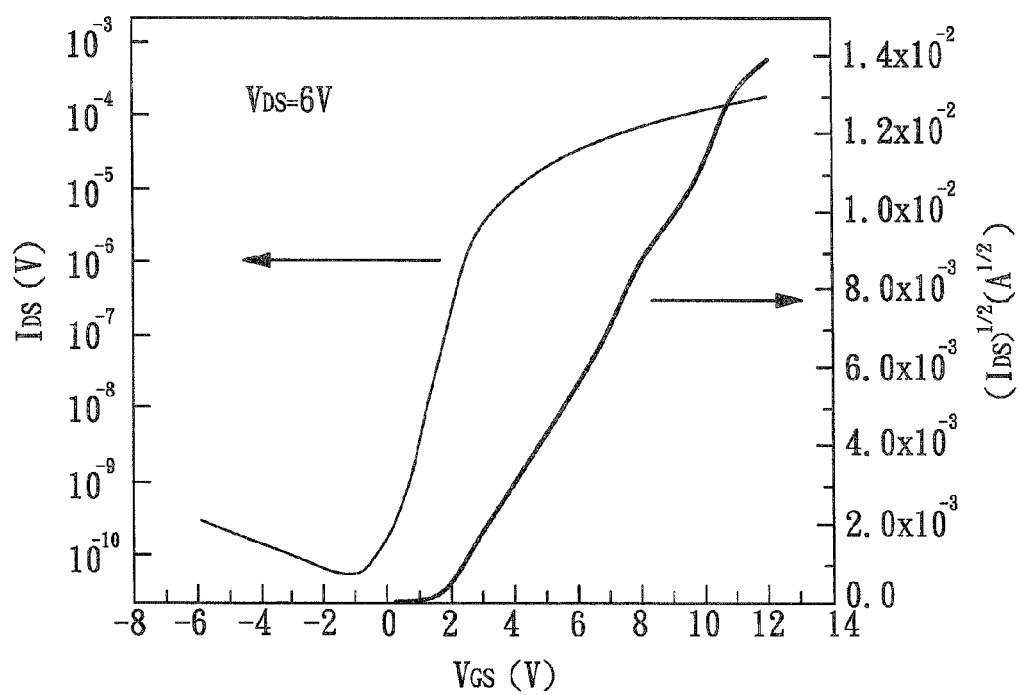
FIG. 6 shows the $V_{GS}$-$I_{DS}$ curve of the thin-film transistor according to one embodiment of the present invention.

FIG. 6 shows the $V_{GS}$-$I_{DS}$ curve of the thin-film transistor according to one embodiment of the present invention, where the $V_{GS}$-$I_{DS}$ curve is obtained at a constant drain-source voltage $V_{DS}$, the left curve is a $V_{GS}$-$I_{DS}$ curve, and the right curve is a $V_{GS}$-$(I_{DS})^{1/2}$ curve. The $V_{GS}$-$I_{DS}$ curve reveals that the drain current of the thin-film transistor has an "on to off ratio" more than $10^6$ orders. The $V_{GS}$-$(I_{DS})^{1/2}$ curve may be fitted by a straight line, whose slope, 17.2 cm$^2$/Vs, is equal to the saturated region mobility (μ FEsat) of the thin-film transistor, and the intersection of the straight line and the abscissa, 1.5V, is equal to the threshold voltage of the thin-film transistor. The low threshold voltage means that the produced thin-film transistor has excellent sensitivity.

By using the seeding layer as the crystal-growing base, the embodiment of the present invention provides a thin-film transistor that can be produced under low temperatures, and successfully forms an inorganic semiconductor layer on an organic dielectric layer. Accordingly, the selectivity of materials to produce the substrate and the gate dielectric layer is broadened, the manufacturing cost is decreased, and the yield is increased.

Although specific embodiments have been illustrated and described, it will be appreciated by those skilled in the art that various modifications may be made without departing from the scope of the present invention, which is intended to be limited solely by the appended claims.

What is claimed is:

1. A method for forming a thin-film transistor, comprising the steps of:
   providing a substrate;
   forming a first patterned conducting layer on said substrate;
   forming an organic dielectric layer on said first patterned conducting layer and said substrate;
   forming a seeding layer on said organic dielectric layer;
   using said seeding layer as a crystal-growing base to form an inorganic semiconductor layer on said seeding layer by a hydrothermal process performed in a closed container; and
   forming a second patterned conducting layer on said inorganic semiconductor layer.

2. The method as recited in claim 1, wherein the processing temperatures of all of said steps are controlled to be equal to or less than 200° C.

3. The method as recited in claim 2, wherein said inorganic semiconductor layer is formed by spin coating, dip coating, electrochemical method, thermal evaporation, chemical vapor deposition, molecular beam epitaxy, or anode aluminum oxide (AAO) method.

4. The method as recited in claim 1, wherein said organic dielectric layer is employed for hindering current from passing therethrough, and is made of a material with High K or Low K.

5. The method as recited in claim 1, wherein said organic dielectric layer is formed by thermal evaporation, spin coating, dip coating, or ink printing.

6. The method as recited in claim 1, wherein said organic dielectric layer is made of polymethylmethacrylate (PMMA) or polystyrene (PS), firstly the material for forming said organic dielectric layer is dissolved in a solvent to form an organic dielectric solution, secondly said organic dielectric solution is formed on said first patterned conducting layer and said substrate, and thirdly said solvent is removed by a heating process to form said organic dielectric layer.

7. The method as recited in claim 6, wherein said solvent is selected from the group consisting of chloroform, dichloromethane, toluene, tetrahydrofuran, 1,2-dichlorobenzene, 1,4-dichlorobenzene, chlorobenzene, n-hexane, and combinations thereof.

8. The method as recited in claim 1, wherein said seeding layer is made of zinc oxide, gold, tin, or cobalt.

9. The method as recited in claim 8, wherein said seeding layer is formed by evaporation or sputtering to deposit nano-grains of zinc oxide, gold, tin, or cobalt on said organic dielectric layer.

10. The method as recited in claim 8, wherein said seeding layer is formed by firstly the precursor for producing the seeding layer being dissolved in a solvent to form a seeding solution, secondly the seeding solution being deposited on said organic dielectric layer, thirdly said solvent being removed to form an intermediate layer on said organic dielectric layer, and fourthly a heating or annealing process is performed to fabricate micro and/or nano-grains in the intermediate layer, so as to form the seeding layer.

11. The method as recited in claim 10, wherein said solvent is selected from the group consisting of isopropanol, methanol, ethyl alcohol, glycerol, propanol, and combinations thereof.

12. The method as recited in claim 10, wherein said seeding solution comprises zinc acetate dehydrate, monoethanalamine (MEA), and isopropanol (IPA).

13. The method as recited in claim 1, before said hydrothermal process, the method further comprises dissolving the material for forming the inorganic semiconductor layer with an aqueous solution to form an inorganic semiconductor solution.

14. The method as recited in claim 1, wherein said inorganic semiconductor solution comprises zinc oxide, zinc nitrate dehydrate, hexamethylenetetramine, and de-ionized water.

15. The method as recited in claim 1, wherein the temperature of said hydrothermal process is controlled at about 55° C. to 100° C.

16. A thin-film transistor, comprising:
a substrate;
a first patterned conducting layer on said substrate as the gate of said thin-film transistor;
an organic dielectric layer on said first patterned layer and said substrate;
a seeding layer on said organic dielectric layer;
an inorganic semiconductor layer formed on said seeding layer by a hydrothermal process performed in a dosed container; and
a second patterned conducting layer on said inorganic semiconductor layer as the source and drain of said thin-film transistor.

17. The thin-film transistor as recited in claim 16, wherein said substrate is made of plastics, glass, ceramics, silicon, indium tin oxide, or other conducting or non-conducting materials.

18. The thin-film transistor as recited in claim 16, wherein said organic dielectric layer is made of a material selected from the group consisting of polymethylmethacrylate (PMMA), polystyrene (PS), polyimide (PI), polyvinyl pyrrolidone (PVP), polyvinyl alcohol (PVA), polyethylene terephthalate (PET), polycarbonates (PC), polyethylene 2,6-naphthalate (PEN), polyethersulfone (PES), polyetherimide (PEI), metallocene based cyclic olefin copolymer (mCOC), and derivatives thereof.

19. The thin-film transistor as recited in claim 16, wherein said seeding layer comprises zinc oxide, gold, tin, or cobalt.

20. The thin-film transistor as recited in claim 16, wherein said inorganic semiconductor layer comprises zinc oxide.

21. The thin-film transistor as recited in claim 16, wherein the morphology of said inorganic semiconductor layer comprises nano grains, nano columns, nano clusters, or nano films.

22. The thin-film transistor as recited in claim 16, wherein said first patterned conducting layer and said second patterned conducting layer are made of metal, inorganic conducting materials, or conducting polymers.

* * * * *